US008372756B2

(12) United States Patent  
Mitchell et al.

(10) Patent No.: US 8,372,756 B2
(45) Date of Patent: Feb. 12, 2013

(54) SELECTIVE ETCHING OF SILICON DIOXIDE COMPOSITIONS

(75) Inventors: Glenn Michael Mitchell, Sellersville, PA (US); Stephen Andrew Motika, Kutztown, PA (US); Andrew David Johnson, Doylestown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 284 days.

(21) Appl. No.: 12/504,064

(22) Filed: Jul. 16, 2009

(65) Prior Publication Data

US 2010/0055921 A1    Mar. 4, 2010

Related U.S. Application Data

(60) Provisional application No. 61/092,916, filed on Aug. 29, 2008.

(51) Int. Cl.
*H01L 21/302* (2006.01)

(52) U.S. Cl. ........ 438/723; 438/706; 438/710; 438/712; 438/719; 216/67; 216/79; 216/80

(58) Field of Classification Search ............ 216/67, 216/79, 80
See application file for complete search history.

(56) References Cited

U.S. PATENT DOCUMENTS

| | | | |
|---|---|---|---|
| 4,687,543 A * | 8/1987 | Bowker | 438/733 |
| 5,021,121 A | 6/1991 | Groechel et al. | |
| 5,830,807 A | 11/1998 | Matsunaga et al. | |
| 6,057,211 A * | 5/2000 | Schwalke | 438/428 |
| 6,103,137 A | 8/2000 | Park | |
| 6,399,514 B1 | 6/2002 | Marks et al. | |
| 6,530,380 B1 | 3/2003 | Zhou et al. | |
| 6,565,759 B1 | 5/2003 | Chen et al. | |
| 6,849,557 B1 | 2/2005 | Ko | |
| 2003/0099028 A1 | 5/2003 | Cho et al. | |
| 2005/0026430 A1 | 2/2005 | Kim et al. | |
| 2007/0224829 A1 * | 9/2007 | Ji et al. | 438/710 |

FOREIGN PATENT DOCUMENTS

| CN | 1624881 A | 6/2005 |
|---|---|---|
| WO | 00/72370 A1 | 11/2000 |

OTHER PUBLICATIONS

H. Xiao, Introduction to Semiconductor Manufacturing Technology, published by Prentice Hall, 2001, ISNB 0-13-022404-9, pp. 230-231.*

J. Rentsch et al, Plasma etching for industrial in-line processing of c-Si solar cells, 3rd World Conference on Photovoltaic Energy Conversion, May 11-18, 2003, Osaka, Japan. pp. 1376-1379.

W.A. Nositschka et al, Dry phosphorus silicate glass etching for multicrystalline silicon solar cells, Prog. Photovolt: Res. Appl. 2003: 11, pp. 445-451.

(Continued)

*Primary Examiner* — Lan Vinh
*Assistant Examiner* — Jiong-Ping Lu
(74) *Attorney, Agent, or Firm* — Rosaleen P. Morris-Oskanian

(57) ABSTRACT

A process for selectively etching a material comprising $SiO_2$ over silicon, the method comprising the steps of: placing a silicon substrate comprising a layer of a material comprising $SiO_2$ within a reactor chamber equipped with an energy source; creating a vacuum within the chamber; introducing into the reactor chamber a reactive gas mixture comprising a fluorine compound, a polymerizable fluorocarbon, and an inert gas, wherein the reactive gas mixture is substantially free of added oxygen; activating the energy source to form a plasma activated reactive etching gas mixture within the chamber; and selectively etching the material comprising $SiO_2$ preferentially to the silicon substrate.

14 Claims, 7 Drawing Sheets

OTHER PUBLICATIONS

J. Rentsch et al, Industrialisation of dry phosphorus silicate glass etching and edge isolation for crystalline silicon solar cells, 20th European Photovoltaic Solar Energy Conference and Exhibition, Jun. 6-10, 2005, Barcelona.

J. Rentsch et al, Dry phosphorus silicate glass etching for crystalline si solar cells, 19th European Photovoltaic Solar Energy Conference, Jun. 7-11, 2004, Paris.

Yukio Iijima et al, Highly selective $SiO_2$ etch employing inductively coupled hydro-fluorocarbon . . . , Jpn. J. Appln. Phys. vol. 36 1997, Part 1, No. 9A, pp. 5498-5502.

Seiji Samukawa et al, Polymerization for highly selective $SiO_2$ plasma etching, Jpn. J. Appl. Phys. vol. 32 1993, Part 2, No. 9A, pp. L1289-L1292.

Toshiyuki Tanaka et al, Effects of molecular structure of feed gases on oxide etching using UHF fluorocarbon plasma, ICPIG, Proceedings, 25th, 2001 vol. 2, pp. 29-30.

Miyako Matsui et al, Mechanism of highly selective $SiO_2$ contact hole etching, ICPIG, Proceedings, 25th, 2001 vol. 2, pp. 5-6.

Zongyu Li et al, The tuning of nitride to oxide selectivity by controlling CxHyF flow, pressure and RF power in the MXP+ dielectric etcher, Proceedings, Electrochemical Soc. 1996, 96-12, pp. 499-504.

Nagai, M., et al.; "Silicon Oxide Selective Employing Dual Frequency Superimposed Magnetron Sputtering of Carbon using $F_2$/Ar Gases"; Japanese Journal of Applied Physics, Japan Society of Applied Physics, JP; vol. 46, No. 2; Feb. 1, 2007; pp. 799-802.

* cited by examiner

SELECTIVE ETCHING OF SILICON DIOXIDE COMPOSITIONS

CROSS REFERENCE TO RELATED APPLICATIONS

This patent application claims the benefit of U.S. Provisional Patent Application Ser. No. 61/092,916 filed 29 Aug. 2008.

BACKGROUND OF THE INVENTION

The present invention is directed to selectively dry etching a material comprising silicon dioxide over silicon. In particular, the present invention is directed to selectively dry etching phosphorous silicate glass (PSG) over crystalline silicon (doped or undoped) in the manufacture of photovoltaic solar cells.

PSG is formed in solar cell processing during emitter diffusion by exposing a crystalline silicon substrate to phosphorous oxychloride ($POCl_3$) gas. Under an oxygen atmosphere phosphorous is driven into the silicon to form the $n^+$ emitter of the solar cell. After the phosphorous diffusion process, the PSG is removed. Prior art processes for PSG removal typically employ wet chemicals such as, for example, hydrofluoric acid (HF), which are extremely harmful to environment and to the handlers.

Dry plasma etching processes have also been developed for PSG removal that do not suffer from the drawbacks of wet chemical processes. Such processes typically rely on fluorocarbon gases that, in the plasma state, form a polymer layer on the surface. Selectivity between the PSG and silicon is mainly attributed to the formation of this polymer layer because its growth on silicon surfaces is much faster thereby preventing further etching of the silicon. Such prior art dry plasma processes typically employ oxygen in the plasma to limit the amount of polymer formation. Oxygen plasmas, however, are problematic for several reasons. For example, in semiconductor applications, oxygen plasmas are known to damage the dielectric properties of low dielectric materials. Moreover, in solar cell applications where a PSG layer is being etched from a layer of phosphorous doped silicon, oxygen plasma tends to form $SiO_2$ on the doped silicon surface which acts as an insulator by hindering the flow of electrons through the layer. Accordingly, there is a need in the art for a process for selectively etching a material comprising $SiO_2$ over silicon that does not suffer from the above-mentioned drawbacks.

BRIEF SUMMARY OF THE INVENTION

The present invention satisfies this need in the art by providing a process for selectively etching a material comprising $SiO_2$ preferentially to silicon, the process comprising the steps of: placing a silicon substrate having a layer of a material comprising $SiO_2$ within a reactor chamber equipped with an energy source; creating a vacuum within the chamber; introducing into the reactor chamber a reactive gas mixture comprising a fluorine compound, a polymerizable fluorocarbon, and an inert gas, wherein the reactive gas mixture is substantially free of oxygen; activating the energy source to form a plasma activated reactive etching gas mixture within the chamber; and selectively etching the material comprising $SiO_2$ preferentially to the silicon substrate.

In another aspect the present invention provides a process for selectively etching a material comprising $SiO_2$ preferentially to silicon, the method comprising the steps of: placing a silicon substrate having a layer of a material comprising $SiO_2$ within a reactor chamber equipped with electrodes; creating a vacuum within the chamber; introducing into the reactor chamber a reactive gas mixture comprising a fluorine compound, a polymerizable fluorocarbon, and an inert gas, wherein the reactive gas mixture is substantially free of oxygen; supplying a high frequency electrical energy to the electrodes to form a plasma activated reactive etching gas mixture within the chamber; and selectively etching the material comprising $SiO_2$ preferentially to the silicon substrate.

DETAILED DESCRIPTION OF THE INVENTION

The present invention provides a process for selectively etching a material comprising $SiO_2$ preferentially to silicon, the process comprising the steps of: placing a silicon substrate having a layer of a material comprising $SiO_2$ within a reactor chamber equipped with an energy source; creating a vacuum within the chamber; introducing into the reactor chamber a reactive gas mixture comprising a fluorine compound, a polymerizable fluorocarbon, and an inert gas, wherein the reactive gas mixture is substantially free of oxygen; activating the energy source to form a plasma activated reactive etching gas mixture within the chamber; and selectively etching the material comprising $SiO_2$ preferentially to the silicon substrate. The process of the present invention as described in detail herein employs a polymer forming fluorocarbon material mixed in a plasma with a fluorine source to aid in the selective etch of PSG or $SiO_2$ over silicon. The unique advantage of the present invention is that the selectivity is achieved in a plasma environment that is substantially free of oxygen. As used herein, the phrase "substantially free of added oxygen" as it relates to a plasma environment refers to a plasma environment where no oxygen is added even though some oxygen may be inherently present depending on the level of vacuum present in the chamber, or oxygen may be produced as a byproduct of the etching process. A surprising aspect of the present invention is the discovery that the addition of a fluorine species to the plasma without oxygen will also result in the favorable fluorocarbon fragmentation and polymer formation which results in the selective etching of PSG or $SiO_2$ preferentially to silicon. The process of the present invention is applicable, for example, to the photovoltaic industry in the manufacture of multicrystalline solar cells, and to the electronics industry in the manufacture of semiconductor devices.

Figure 1:
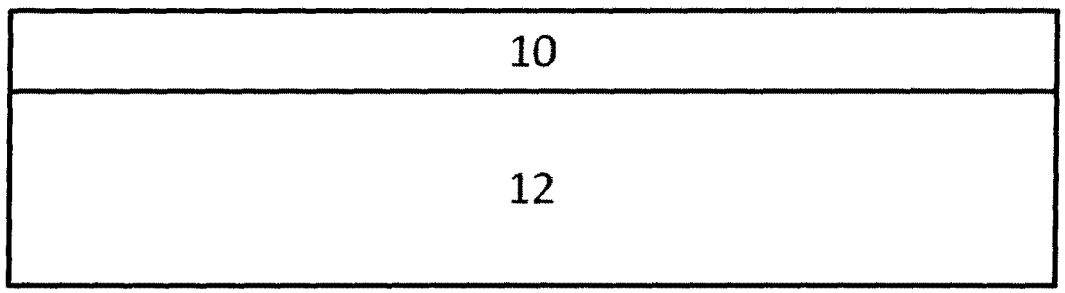
FIG. 1 is an illustration of a layer of a silicon substrate comprising a layer of a material comprising $SiO_2$.

The process of the present invention comprises the step of placing a silicon substrate having a layer of a material comprising $SiO_2$ within a reactor chamber equipped with an energy source. As used herein, the term "silicon substrate" refers to silicon in its various forms such as monocrystalline silicon, microcrystalline silicon, polysilicon, amorphous silicon, and epitaxial silicon. The silicon substrate can be doped or undoped. As used herein, the term "doped" as it refers to the silicon substrate means an added impurity that may lower the resistance of the layer. Typical such impurities include Group III elements such as, for example, B (P-type dopants), and Group V elements such as, for example, As, P, and N (N-type dopants). As used herein, the term "material comprising $SiO_2$" refers to $SiO_2$ or any $SiO_2$-containing material such as, for example, any organosilicate glass (OSG), phosphorous silicate glass (PSG), boron phosphorous silicate glass (BPSG), and fluorosilicate glass (FSG). FIG. 1 provides an example of a silicon substrate comprising a layer of a material comprising $SiO_2$ wherein silicon substrate 12 is, for example, monocrystalline silicon, and layer 10 is, for example, either $SiO_2$ or PSG. The reactor chamber in which the silicon substrate having a layer of a material comprising $SiO_2$ is placed is any reaction chamber suitable for use with a vacuum in a plasma process that is equipped with an energy source sufficient to form a plasma.

The process of the present invention also comprises the step of creating a vacuum within the chamber once the silicon substrate having a layer of a material comprising $SiO_2$ is placed within the chamber and the chamber is sealed. In preferred embodiments, a vacuum is created such that the operating pressure is anywhere from 0.1 to 10,000 mTorr, preferably from 1 to 10,000 mTorr, and more preferably from 1 to 1000 mTorr. The vacuum can be created by any pumping means known to those skilled in the art for creating a vacuum in a vacuum chamber.

The process of the present invention also comprises the step of introducing into the reactor chamber a reactive gas mixture comprising, consisting essentially of, or consisting of, a fluorine compound, a polymerizable fluorocarbon, and an inert gas, wherein the reactive gas mixture is substantially free of oxygen. In the reactive gas mixture the fluorine compound functions to provide fluorine atoms that control the rate of polymer formation as well as etch the $SiO_2$. Preferred fluorine compounds include $NF_3$, $F_2$, $F_2$ created in situ, and mixtures of $F_2$ in an inert gas such as, for example, helium, argon, or nitrogen.

Preferably, the fluorine compound is present in the reactive gas mixture at a concentration of from 1 to 40% by volume, more preferably from 5 to 15% by volume and, most preferably, from 5 to 10% by volume.

As used herein, the term "polymerizable fluorocarbon" refers to a fluorocarbon that is capable of polymerizing under plasma conditions to form a polymer layer on the substrate being etched. In the reactive gas mixture the polymerizable fluorocarbon functions to form a polymer layer on silicon surfaces at a faster rate relative to $SiO_2$-containing surfaces thereby preventing further etching of the silicon. Preferred polymerizable fluorocarbons include, for example, a perfluorocarbon compound having the formula $C_hF_i$ wherein h is a number ranging from 4 to 6 and i is a number ranging from h to 2h+2. Examples of perfluorocarbons having the formula $C_hF_i$ include, but are not limited to, $C_4F_8$ (octafluorocyclobutane), $C_5F_8$ (octafluorocyclopentene), $C_6F_6$ (hexafluorobenzene), and $C_4F_6$ (hexafluoro-1,3-butadiene). In some embodiments of the present invention, the polymerizable fluorocarbon is a hydrofluorocarbon having the formula $C_xF_yH_z$ wherein x is a number ranging from 1 to 4 and z is a number ranging from 1 to (2x+1) and y is ((2x+2)−z). Examples of hydrofluorocarbons having the formula $C_xF_yF_z$ include, but are not limited to, $CHF_3$ (trifluoromethane), $C_2F_5H$ (1,1,1,2,2-pentafluoroethane), and $C_3F_7H$ (1,1,1,2,3,3,3 heptafluoropropane). In preferred embodiments, the polymerizable fluorocarbon is hexafluoro-1,3-butadiene.

Preferably, the polymerizable fluorocarbon is present in the reactive gas mixture at a concentration of from 1 to 25% by volume, more preferably from 5 to 15% by volume and, most preferably, from 5 to 10% by volume.

The inert gas component of the reactive gas mixture typically comprises the remainder of the volume percent of the mixture and functions as a diluent/carrier for the fluorine compound and the polymerizable fluorocarbon. Examples of suitable inert gases include argon, helium, nitrogen, and mixtures thereof. The preferred inert gas is argon.

Preferably, the ratio of the fluorine compound to the polymerizable fluorocarbon in the reactive gas mixture is from 0.1 to 20, more preferably from 0.5 to 2.0 and, most preferably the ratio is 1 to 1.

The components of the reactive gas mixture can be delivered to the reaction chamber by a variety of means, such as, for example, conventional cylinders, safe delivery systems, vacuum delivery systems, solid or liquid-based generators that create the chemical reagent and/or the gas mixture at the point of use (POU).

The process of the present invention also includes the step of activating the energy source to form a plasma activated reactive etching gas mixture within the chamber. Here, the reactive gas mixture of the present invention is exposed to one or more energy sources sufficient to generate active species to at least partially react with the dielectric material and form volatile species. The energy source for the exposing step may include, but not be limited to, α-particles, β-particles, γ-rays, x-rays, high energy electron, electron beam sources of energy, ultraviolet (wavelengths ranging from 10 to 400 nm), visible (wavelengths ranging from 400 to 750 nm), infrared (wavelengths ranging from 750 to 105 nm), microwave (frequency >$10^9$ Hz), radio-frequency wave (frequency >$10^4$ Hz) energy; thermal, RF, DC, arc or corona discharge, sonic, ultrasonic or megasonic energy, and combinations thereof.

In one embodiment, the reactive gas mixture is exposed to an energy source sufficient to generate a plasma having active species contained therein. Specific examples of using the plasma for etching processes include, but are not limited to, plasma etching, reactive ion etch (RIE), magnetically enhanced reactive ion etch (MERIE), a inductively coupled plasma (ICP) with or without a separate bias power source, transformer coupled plasma (TCP), hollow anode type plasma, helical resonator plasma, electron cyclotron resonance (ECR) with or without a separate bias power source, RF or microwave excited high density plasma source with or without a separate bias power source, etc. In embodiments wherein a RIE process is employed, the etching process is conducted using a capacitively coupled parallel plate reaction chamber. In these embodiments, the layered substrate (e.g., a patterned wafer) may be placed onto a RF powered lower electrode within a reaction chamber. In embodiments wherein a plasma etching process is employed, the etching process is conducted using a capacitively coupled parallel plate reaction chamber. In these embodiments, the layered substrate (e.g., a patterned wafer) may be placed onto a grounded lower electrode within a reaction chamber. The substrate is held onto the electrode by either a mechanical clamping ring or an electrostatic chuck. The backside of the substrate may be cooled with an inert gas such as helium. The RF power source may be, for example, an RF generator operating at a frequency of 13.56 MHz, however other frequencies can also be used. The RF power density can vary from 0.3 to 30 W/cm$^2$, preferably from 1 to 16 W/cm$^2$. The flow rate of the mixture into the reaction chamber ranges from 10 to 50,000 standard cubic centimeters per minute (sccm), preferably from 20 to 10,000 sccm, and more preferably from 25 to 1,000 sccm.

The process of the present invention also includes the step of selectively etching the material comprising SiO$_2$ over the silicon substrate. As used herein, the term "selectively" or "selectivity" as it refers to etching means a ratio of the etch rate of the material comprising SiO$_2$ preferential to the etch rate of the silicon substrate that is greater than 1.0. Although in theory the higher the selectivity, the better the selectivity of the process, typical selectivities achieved by the process of the present invention range from about 1 to about 100, more preferably from about 5 to about 20 and, most preferably about 10. The selective etching is described in more detail in the examples that follow.

Once the layer of material comprising SiO$_2$ is etched from the silicon substrate, the silicon substrate is ready for additional process steps. For example, if the silicon substrate is a silicon substrate in the manufacture of a solar cell, a layer of silicon nitride may be deposited on the silicon substrate. In preferred embodiments of the process of the present invention, the material comprising SiO$_2$ is etched and a layer of silicon nitride is deposited in the same plasma chamber without breaking vacuum.

The invention will be illustrated in more detail with reference to the following Examples, but it should be understood that the present invention is not deemed to be limited thereto.

EXAMPLES

The reactor used is the Gaseous Electronics Conference (GEC) RF reference plasma reactor configured for capacitively coupled plasmas (CCP). The standard GEC Cell lower electrode was replaced by a custom built electrostatic chuck/powered electrode assembly (Model CP100, Electrogrip Inc.) for 100 mm (4 inch) wafer processing. Helium backside cooling pressure was set at 4 Torr during plasma processing. The electrostatic chuck assembly was cooled by a recirculating coolant at 20° C. inlet temperature. The entire RF powered electrode/electrostatic chuck assembly had a diameter of 150 mm (6 inch). During the experiments, 300 W of RF power at 13.56 MHz was delivered from a RF generator and a matching network to the lower electrode to generate plasmas. The center part of the grounded top electrode was a standard GEC electrode (100 mm diameter) with a feed-gas distribution showerhead. The RF conductor of the top electrode was connected to the grounded chamber wall through a copper strap outside of the vacuum chamber. The showerhead/top electrode assembly was also cooled by a recirculating coolant flow at 20° C. inlet temperature. In reactive ion etch (RIE), the etch rate depends strongly on the DC self-bias and RF voltage at the powered (wafer) electrode. At a given input power, a higher ratio between grounded and powered surface areas typically leads to increased DC self-bias voltage and consequently increased etch rates. To increase the DC self-bias voltage at the powered (wafer) electrode, the top grounded electrode was extended by a grounded annular ring. With the extension, the grounded electrode had a diameter of 230 mm. The spacing between the grounded and powered electrode was 25 mm (1 inch). The flow of process gases was controlled by a set of mass flow controllers and the gases were fed into the reactor through the showerhead on the top electrode. After passing between the electrodes, the process gases and plasma byproducts were pumped out of the reactor through an 8-inch conflat side port by a 510 liter/second turbomolecular pump backed by a multistage dry mechanical pump. The chamber base pressure was about 10$^{-6}$ Torr. During plasma processing, the chamber pressure was measured by a capacitance manometer (MKS Baratron) and controlled by an electronic throttle valve between the reactor and the turbomolecular pump. 5 slm of N$_2$ was injected into the dry mechanical pump through an interstage pump purge.

The examples below employ mixtures of C$_4$F$_6$ and NF$_3$ at various concentrations to etch SiO$_2$, 4% PSG, and polysilicon (or Si).

Figure 2:
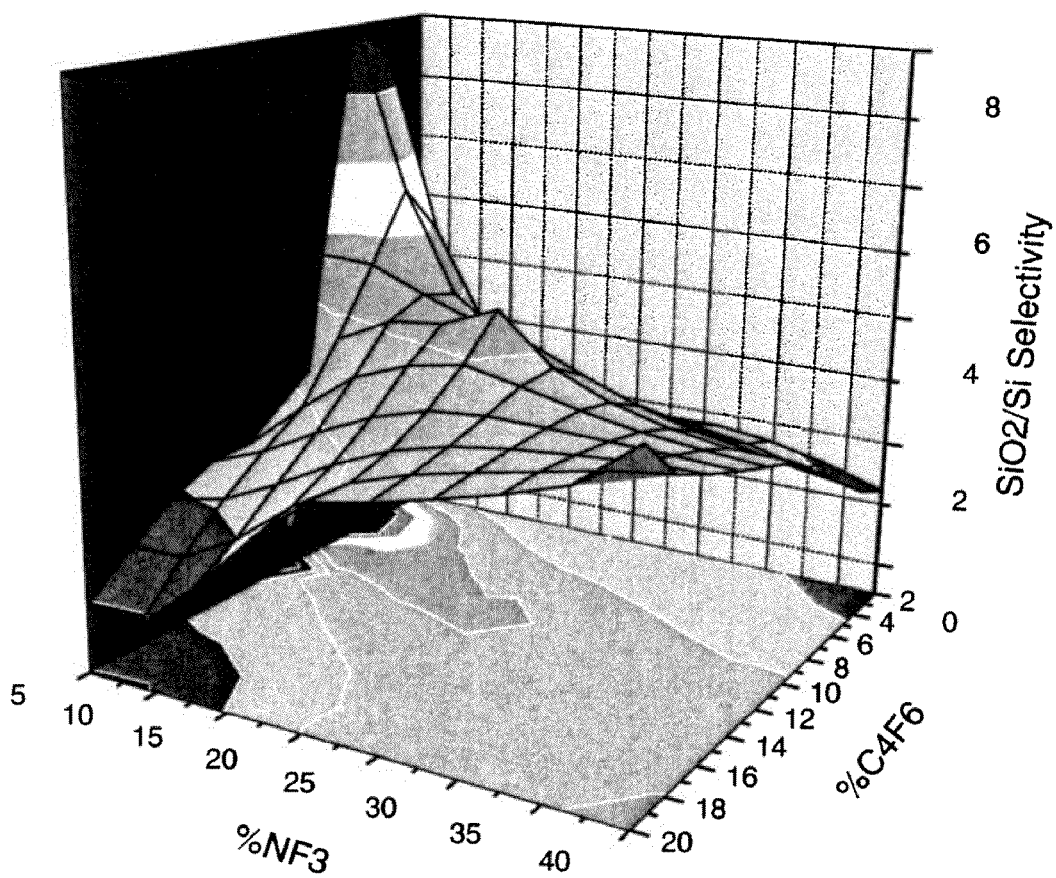
FIG. 2 is a graphic illustration of the conditions evaluated in connection with the etch selectivity of $SiO_2$ over silicon with $C_4F_6/NF_3$ according to the process of the present invention.

Table 1 is the full design of experiments (DOE) for C$_4$F$_6$/NF$_3$ etching of SiO$_2$ and Si. The information in Table 1 suggests that the best conditions for highest selectivity are when % C$_4$F$_6$ is equal to 5% and the % NF$_3$ is equal to 5% at the stated plasma conditions. FIG. 2 represents graphically a model that predicts selectivity over the range of conditions based upon the information in Table 1. The model was prepared by employing Origin Scientific Graphing and Analysis Software™ (version 7.5 SR6) by OriginLab Corporation (Northampton, Mass.). As is evident, there appears to be a channel of conditions that could provide enhanced SiO/Si selectivity.

TABLE 1

SiO2 & Si Etch with C4F6 NF3
Pressure = 35 mTorr, Power = 300 W, 2 min etch except where noted

| % C4F6 | % NF3 | Substrate | sccm C4F6 | sccm NF3 | sccm Ar | Etch Time (min) | Bias Volts V | Etch Rate nm/min. | Selectivity SiO2/Si |
|---|---|---|---|---|---|---|---|---|---|
| 2.5 | 5 | Si | 2.75 | 2.75 | 104.50 | 2 | 975 | 30.1 | |
| 2.5 | 5 | SiO2 | 2.75 | 2.75 | 104.50 | 2 | 960 | 99.1 | 3.29 |
| 5 | 5 | Si | 5.50 | 2.75 | 101.75 | 2 | 1000 | 7.6 | |
| 5 | 5 | SiO2 | 5.50 | 2.75 | 101.75 | 2 | 1000 | 97.3 | 12.86 |
| 10 | 5 | Si | 11.00 | 2.75 | 96.25 | 2 | 1035 | −5.4 | |
| 10 | 5 | SiO2 | 11.00 | 2.75 | 96.25 | 2 | 1050 | −7.1 | 0.00 |
| 20 | 5 | Si | 22.00 | 2.75 | 85.25 | 2 | 970 | −1.1 | |
| 20 | 5 | SiO2 | 22.00 | 2.75 | 85.25 | 2 | 920 | 7.8 | 0.50 |
| 2.5 | 10 | Si | 2.75 | 5.50 | 101.75 | 2 | 935 | 54.8 | |
| 2.5 | 10 | SiO2 | 2.75 | 5.50 | 101.75 | 2 | 910 | 104.7 | 1.91 |
| 5 | 10 | Si | 5.50 | 5.50 | 99.00 | 2 | 940 | 29.8 | |
| 5 | 10 | SiO2 | 5.50 | 5.50 | 99.00 | 2 | 940 | 122.6 | 4.11 |
| 10 | 10 | Si | 11.00 | 5.50 | 93.50 | 2 | 980 | 19.3 | |
| 10 | 10 | SiO2 | 11.00 | 5.50 | 93.50 | 2 | 990 | 82.4 | 4.28 |

TABLE 1-continued

SiO2 & Si Etch with C4F6 NF3
Pressure = 35 mTorr, Power = 300 W, 2 min etch except where noted

| % C4F6 | % NF3 | Substrate | sccm C4F6 | sccm NF3 | sccm Ar | Etch Time (min) | Bias Volts V | Etch Rate nm/min. | Selectivity SiO2/Si |
|---|---|---|---|---|---|---|---|---|---|
| 20 | 10 | Si | 22.00 | 5.50 | 82.50 | 2 | 960 | −42.0 | |
| 20 | 10 | SiO2 | 22.00 | 5.50 | 82.50 | 2 | 1015 | −26.1 | 0.00 |
| 2.5 | 20 | Si | 2.75 | 11.00 | 96.25 | 2 | NA | 86.1 | |
| 2.5 | 20 | SiO2 | 2.75 | 11.00 | 96.25 | 2 | 855 | 114.1 | 1.33 |
| 5 | 20 | Si | 5.50 | 11.00 | 93.50 | 2 | 900 | 49.7 | |
| 5 | 20 | SiO2 | 5.50 | 11.00 | 93.50 | 2 | 895 | 123.8 | 2.49 |
| 10 | 20 | Si | 11.00 | 11.00 | 88.00 | 2 | 915 | 31.6 | |
| 10 | 20 | Si | 11.00 | 11.00 | 88.00 | 2 | 910 | 26.8 | |
| 10 | 20 | Si | 11.00 | 11.00 | 88.00 | 2 | 915 | 24.2 | |
| 10 | 20 | SiO2 | 11.00 | 11.00 | 88.00 | 2 | 910 | 128.4 | 4.06 |
| 10 | 20 | SiO2 | 11.00 | 11.00 | 88.00 | 2 | 910 | 123.8 | 4.62 |
| 10 | 20 | SiO2 | 11.00 | 11.00 | 88.00 | 2 | 915 | 131.5 | 5.43 |
| 20 | 20 | Si | 22.00 | 11.00 | 77.00 | 2 | 975 | 11.8 | |
| 20 | 20 | SiO2 | 22.00 | 11.00 | 77.00 | 2 | 975 | 33.9 | 2.88 |
| 2.5 | 40 | Si | 2.75 | 22.00 | 85.25 | 2 | 810 | 125.9 | |
| 2.5 | 40 | SiO2 | 2.75 | 22.00 | 85.25 | 2 | 805 | 123.5 | 0.98 |
| 5 | 40 | Si | 5.50 | 22.00 | 82.50 | 2 | 810 | 80.4 | |
| 5 | 40 | SiO2 | 5.50 | 22.00 | 82.50 | 2 | 820 | 129.5 | 1.61 |
| 10 | 40 | Si | 11.00 | 22.00 | 77.00 | 2 | 840 | 49.8 | |
| 10 | 40 | SiO2 | 11.00 | 22.00 | 77.00 | 2 | 850 | 140.3 | 2.81 |
| 20 | 40 | Si | 22.00 | 22.00 | 66.00 | 2 | 870 | 26.4 | |
| 20 | 40 | SiO2 | 22.00 | 22.00 | 66.00 | 2 | 870 | 117.0 | 4.43 |

Figure 3:
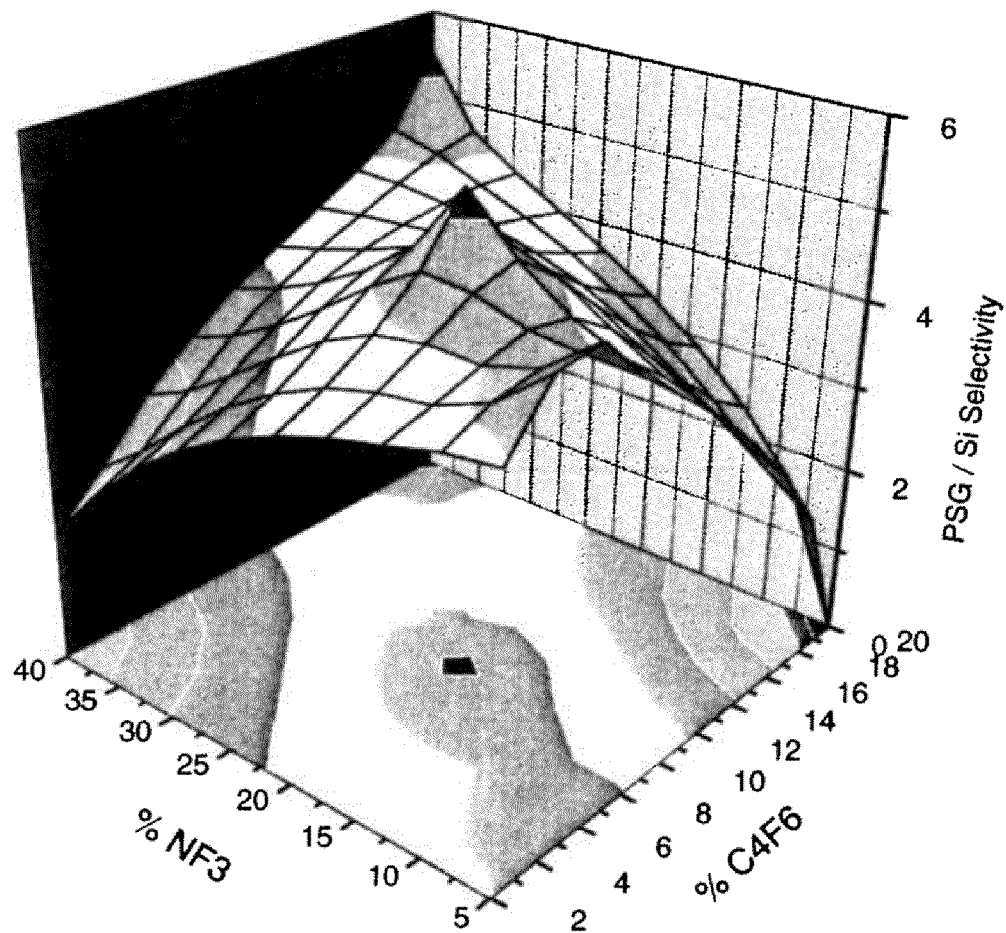
FIG. 3 is a graphic illustration of the conditions evaluated in connection with the etch selectivity of PSG over silicon with $C_4F_6/NF_3$ according to the process of the present invention.

Table 2 is a smaller DOE for $C_4F_6$/$NF_3$ etching of 4% PSG and Si based on the information in Table 1 and FIG. 2. The information in Table 2 suggests that the best conditions for highest selectivity are when the concentration of $C_4F_6$ is equal to 5% and the concentration of $NF_3$ is equal to 5% at the stated plasma conditions. FIG. 3 represents graphically a model that predicts selectivity over the range of conditions based upon the information in Table 2. The model was prepared by employing Origin Scientific Graphing and Analysis Software™ (version 7.5 SR6) by OriginLab Corporation (Northampton, Mass.). As is evident, there appears to be a channel of conditions that could provide enhanced SiO/Si selectivity.

Also, the increase in selectivity observed between $CF_4$/$NF_3$ and $C_4F_6$/$NF_3$, strongly suggests that the increased selectivity is due to the superior polymer forming ability of $C_4F_6$ under plasma conditions relative to $CF_4$ without the presence of oxygen.

Figure 5:
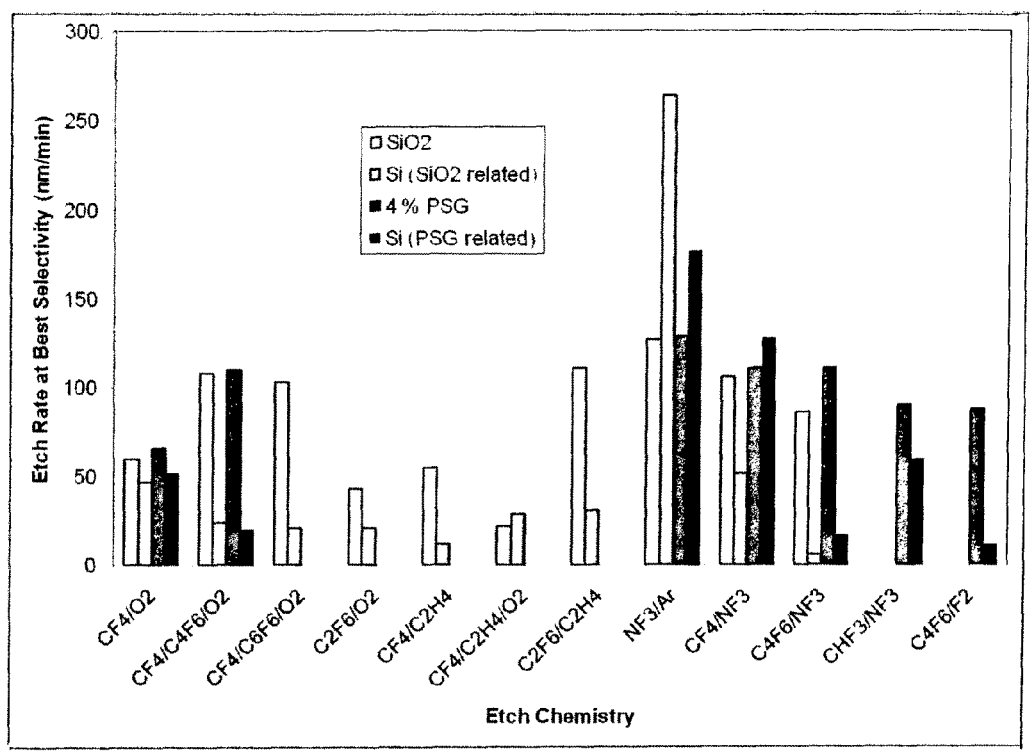
FIG. 5 is a graphic summary of etch rate data for $SiO_2$, 4% PSG, and Si for various etch chemistries evaluated.

FIG. 5 presents a summary plot of all etch chemistries evaluated and the resultant best etch rates (related to the best selectivity) for $SiO_2$, 4% PSG, and Si. It is important to note that the silicon etch rate in relation to both PSG and $SIO_2$ is diminished in the $C_4F_6$ chemistry due to the higher rate of polymer formation.

Figure 6:
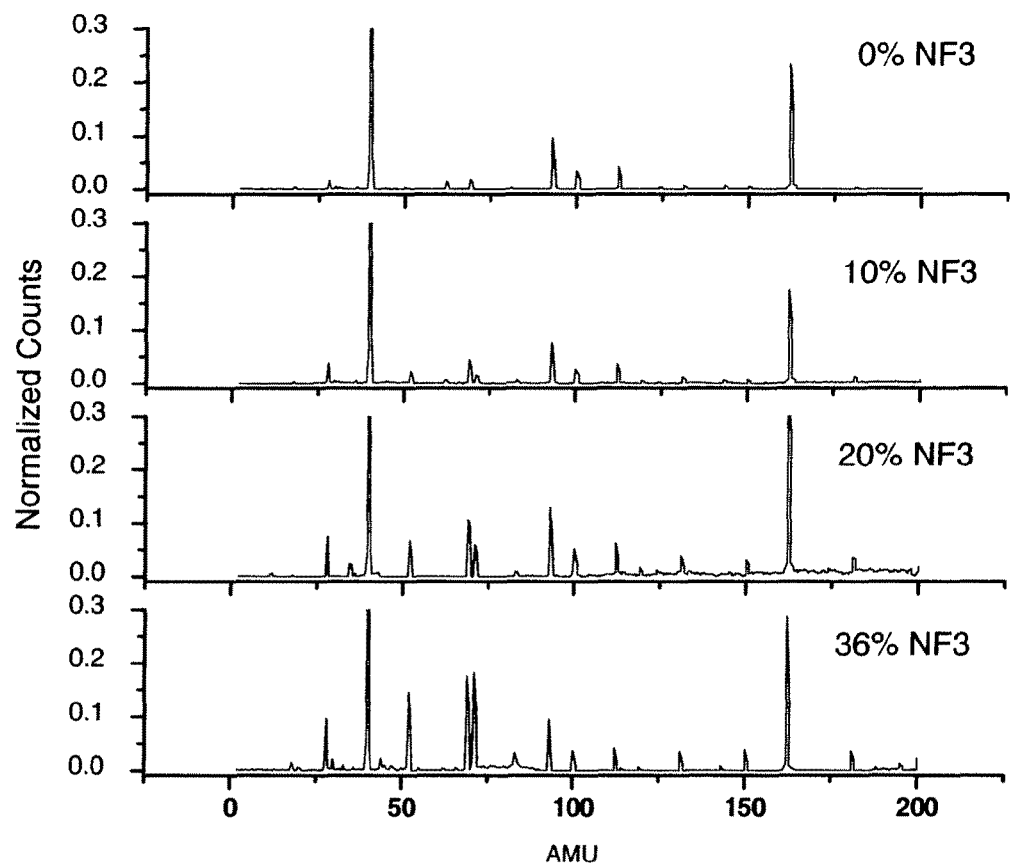
FIG. 6 illustrates a series of mass spectral data demonstrating the effect of $NF_3$ on $C_4F_6$ in a plasma while etching $SiO_2$ and Si.
Figure 7:
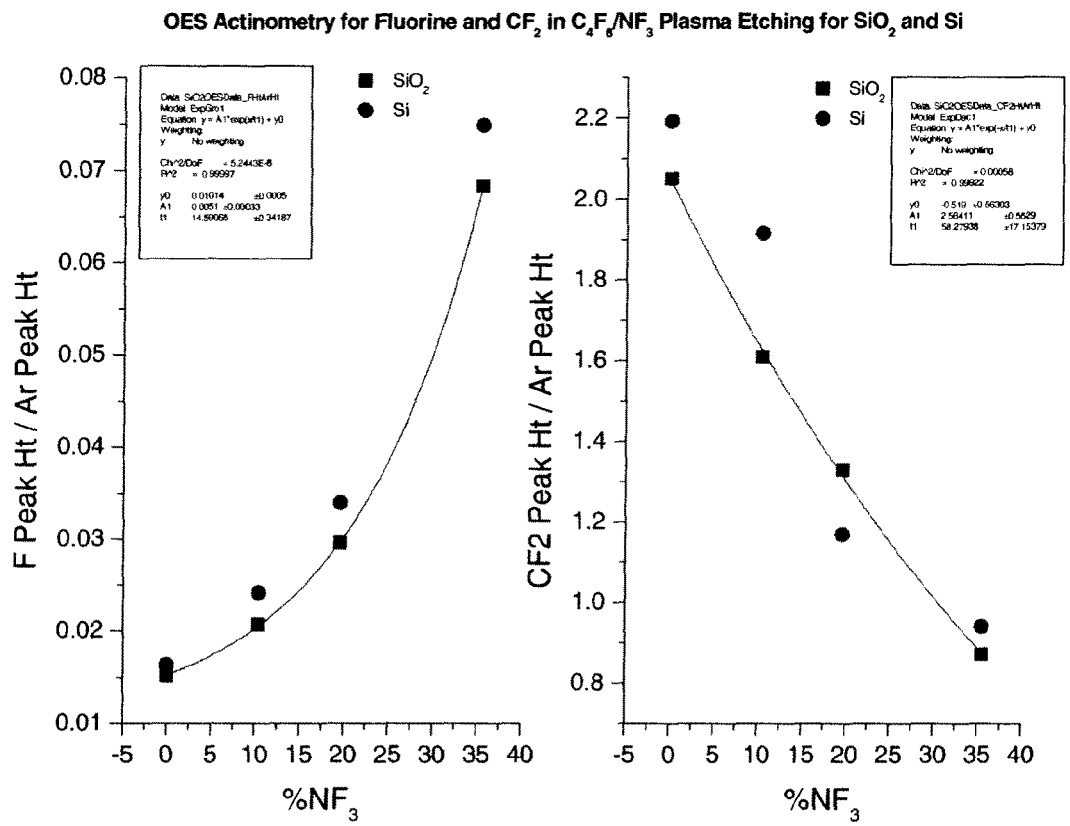
FIG. 7 illustrates the in situ optical emission spectral data monitoring F and $CF_2$ species during a selective etch according to the present invention.

FIGS. 6 and 7 present $C_4F_6$/$NF_3$ $SiO_2$ and Si data as measured by in-situ instrumentation. The data within these plots

TABLE 2

4% PSG & SI Etch with C4F6 NF3
Pressure = 35 mTorr, Power = 300 W, 2 min etch except where noted

| % C4F6 | % NF3 | Substrate | sccm C4F6 | sccm NF3 | sccm Ar | Etch Time min | Bias Volts V | Etch Rate nm/min. | Selectivity 4% PSG/SI |
|---|---|---|---|---|---|---|---|---|---|
| 2.5 | 5 | Si | 2.75 | 2.75 | 104.50 | 2.00 | 965 | 23.9 | |
| 2.5 | 5 | 4% PSG | 2.75 | 2.75 | 104.50 | 2.00 | 965 | 106.8 | 4.47 |
| 5 | 5 | Si | 5.50 | 2.75 | 101.75 | 2.00 | 985 | 16.6 | |
| 5 | 5 | Si | 5.50 | 2.75 | 101.75 | 2.00 | 990 | 19.1 | |
| 5 | 5 | 4% PSG | 5.50 | 2.75 | 101.75 | 2.00 | 985 | 110.8 | 6.66 |
| 5 | 5 | 4% PSG | 5.50 | 2.75 | 101.75 | 2.00 | 990 | 102.7 | 5.37 |
| 20 | 5 | Si | 22.00 | 2.75 | 85.25 | 2.00 | 975 | −1.6 | |
| 20 | 5 | 4% PSG | 22.00 | 2.75 | 85.25 | 2.00 | 990 | −86.5 | 0.00 |
| 5 | 10 | Si | 5.50 | 5.50 | 99.00 | 2.00 | 945 | 30.5 | |
| 5 | 10 | 4% PSG | 5.50 | 5.50 | 99.00 | 2.00 | 930 | 128.6 | 4.22 |
| 10 | 20 | Si | 11.00 | 11.00 | 88.00 | 2.00 | 905 | 23.3 | |
| 10 | 20 | 4% PSG | 11.00 | 11.00 | 88.00 | 2.00 | 895 | 138.4 | 5.95 |
| 2.5 | 40 | Si | 2.75 | 22.00 | 85.25 | 2.00 | 810 | 145.2 | |
| 2.5 | 40 | 4% PSG | 2.75 | 22.00 | 85.25 | 1.97 | 800 | 149.0 | 1.03 |
| 20 | 40 | Si | 22.00 | 22.00 | 66.00 | 2.00 | 870 | 20.5 | |
| 20 | 40 | 4% PSG | 22.00 | 22.00 | 66.00 | 2.00 | 865 | 113.1 | 5.52 |

Figure 4:
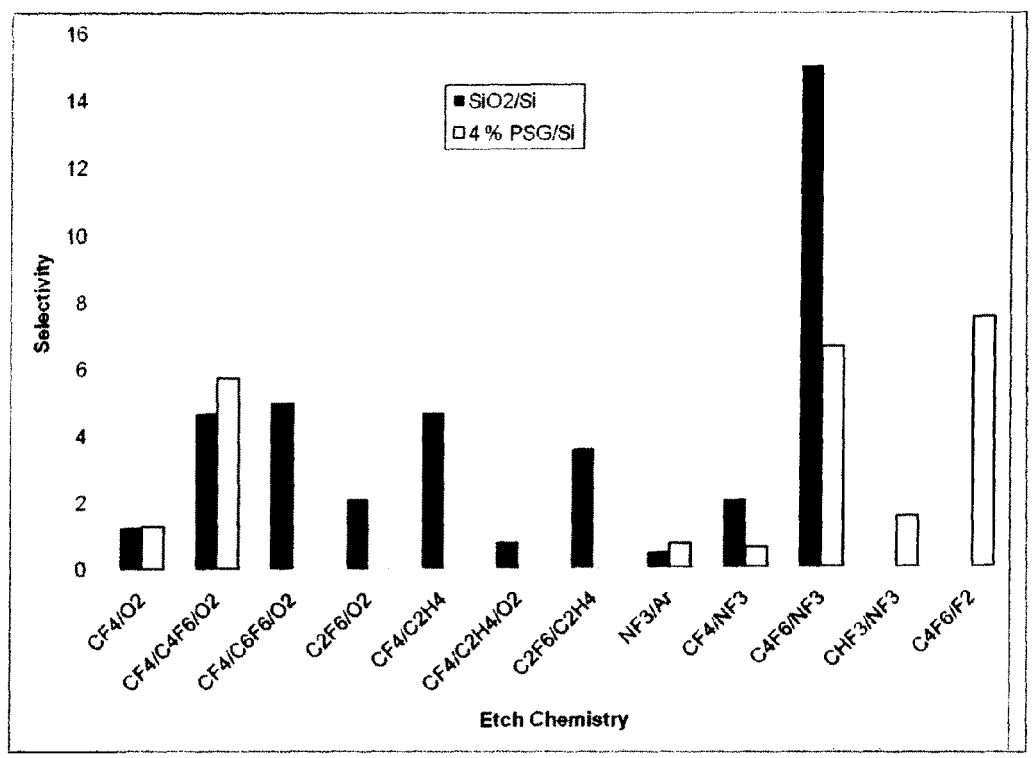
FIG. 4 is a graphic summary of selectivity data for $SiO_2$/Si and 4% PSG/Si for various etch chemistries evaluated.

FIG. 4 presents a summary plot of all etch chemistries evaluated and the resultant best selectivities for $SiO_2$/Si and 4% PSG/Si. The increase in selectivity with the addition of $C_4F_6$ to a fluorocarbon plasma ($CF_4$) supports the enhanced selectivity as a result of the process of the present invention.

illustrates that the addition of $NF_3$ to $C_4F_6$ in a plasma (free of added oxygen) alters the $C_4F_6$ fragmentation within the plasma. Without intending to be bound by any particular theory, the foregoing examples suggest that the use of $NF_3$ decreases the quantity of smaller $C_4F_6$ fragments which, in turn, effects how $C_4F_6$ polymerizes on the surface of an $SiO_2$ or Si film, and thus affects the etch rate and selectivity.

The invention claimed is:

1. A process for selectively etching a material comprising $SiO_2$ preferentially to silicon, the method comprising the steps of:
   placing a silicon substrate having a layer of a material comprising $SiO_2$ within a reactor chamber equipped with an energy source;
   creating a vacuum within the chamber;
   introducing into the reactor chamber a reactive gas mixture comprising a fluorine compound, a polymerizable fluorocarbon, and an inert gas, wherein no oxygen is added to the reactive gas mixture, wherein the fluorine compound is selected from the group consisting of: $NF_3$, $F_2$, $F_2$ created in situ, and a mixture of $F_2$ in an inert gas, and wherein the polymerizable fluorocarbon comprises a compound having the formula $C_hF_i$ wherein h is a number ranging from 4 to 6 and i is a number ranging from h to 2h+2;
   activating the energy source to form a plasma activated reactive etching gas mixture within the chamber; and
   selectively etching the material comprising $SiO_2$ preferentially to the silicon substrate.

2. The process of claim 1 wherein the polymerizable fluorocarbon and the fluorine compound in the reactive gas mixture are present at a ratio of 1:1.

3. The process of claim 1 wherein the material comprising $SiO_2$ is selected from the group consisting of: $SiO_2$ and an organosilicate glass.

4. The process of claim 3 wherein the organosilicate glass is selected from the group consisting of phosphorous silicate glass and fluorosilicate glass.

5. The process of claim 4 wherein the material comprising $SiO_2$ is phosphorous silicate glass.

6. The process of claim 3 wherein the material comprising $SiO_2$ is substantially $SiO_2$.

7. The process of claim 1 wherein the fluorine compound is $NF_3$.

8. The process of claim 1 wherein the polymerizable fluorocarbon is selected from the group consisting of: octafluorocyclobutane, octafluorocyclopentene, hexafluorobenzene, hexafluoro-1,3-butadiene and mixtures thereof.

9. The process of claim 8, wherein the polymerizable fluorocarbon is hexafluoro-1,3-butadiene.

10. A process for selectively etching a material comprising $SiO_2$ preferentially to silicon, the method comprising the steps of:
    placing a silicon substrate having a layer of a material comprising $SiO_2$ within a reactor chamber equipped with electrodes;
    creating a vacuum within the chamber;
    introducing into the reactor chamber a reactive gas mixture comprising a fluorine compound, a polymerizable fluorocarbon, and an inert gas, wherein no oxygen is added to the reactive gas mixture, and wherein the fluorine compound is selected from the group consisting of: $NF_3$, $F_2$, $F_2$ created in situ, and a mixture of $F_2$ in an inert gas, and wherein the polymerizable fluorocarbon comprises a compound having the formula $C_hF_i$ wherein h is a number ranging from 4 to 6 and i is a number ranging from h to 2h+2;
    supplying a high frequency electrical energy to the electrodes to form a plasma activated reactive etching gas mixture within the chamber; and
    selectively etching the material comprising $SiO_2$ preferentially to the silicon substrate.

11. The process of claim 10 wherein the ratio of the fluorine compound to the polymerizable fluorocarbon is from 1 to 2.

12. The process of claim 11 wherein the ratio of the fluorine compound to the polymerizable fluorocarbon is from 1 to 1.

13. The process of claim 10 wherein the polymerizable fluorocarbon is selected from the group consisting of: octafluorocyclobutane, octafluorocyclopentene, hexafluorobenzene, hexafluoro-1,3-butadiene and mixtures thereof.

14. The process of claim 13 wherein the polymerizable fluorocarbon is hexafluoro-1,3-butadiene.

* * * * *